July 17, 1962 J. W. SKERRITT 3,045,128

BISTABLE MULTIVIBRATOR

Filed July 1, 1958

ALTERNATIVE STEERING GATE FOR FIG. 1

INVENTOR.
JOHN W. SKERRITT

BY Edgar H. Kent

ATTORNEY

United States Patent Office
3,045,128
Patented July 17, 1962

3,045,128
BISTABLE MULTIVIBRATOR

John W. Skerritt, Kingston, N.Y., assignor to International Business Machines Corporation, New York, N.Y., a corporation of New York Filed July 1, 1958, Ser. No. 745,886
7 Claims. (Cl. 307—88.5)

Figures 1, 2:
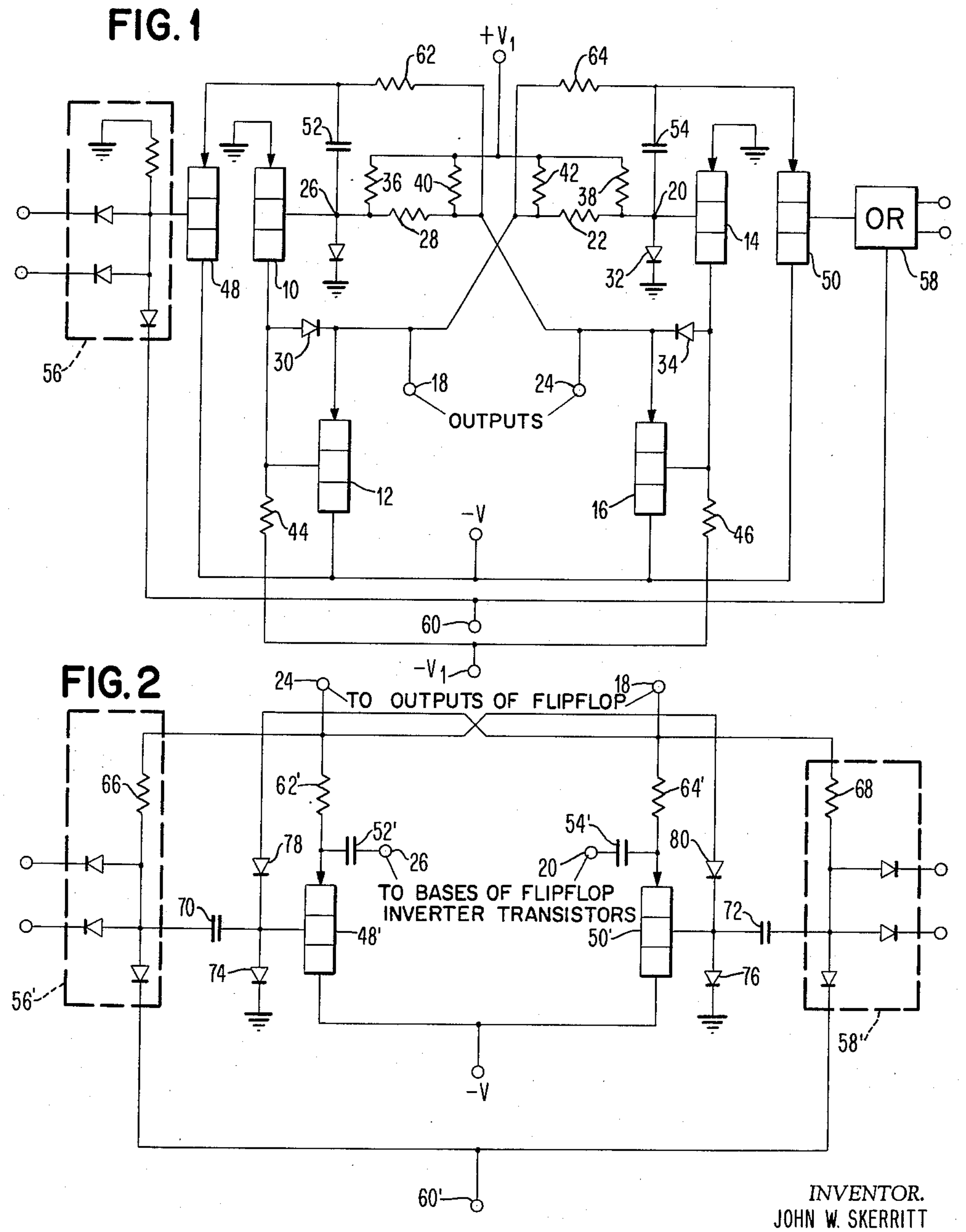

This invention relates to bistable multivibrator circuits and to control circuits for such multivibrators.

The bistable multivibrator circuit, frequently denominated a flip-flop, comprises a pair of coupled circuits, one of which is conducting except during periods of transition or switching between the conducting states of the circuits. At alternate intervals, the output of one is used to bias the other to cut-off and vice versa. Such circuitry finds frequent use in computers and when so used one of the coupled circuits is identified with a binary ONE and the other with a binary ZERO. That terminology will be used herein to distinguish between the two similar circuits of the flip-flop.

The use of computers has greatly increased recently and this growth has created, among the many new requirements, demands for: (1) circuitries of higher operational speed, (2) improved loading characteristics of such circuits, and (3) increased versatility of logical circuit components suitable for utilization in the complex computer circuitries. Transistorized circuitries are being utilized extensively in this area in part because of the advantages flowing from their compact size and low power consumption. Substantial development work has concentrated in the area of bistable circuits and it is a primary object of this invention to provide an improved bistable multivibrator circuit in which transistors may be utilized as components.

Another object of this invention is to provide an improved control circuit particularly suitable for use with a transistorized bistable circuit.

Another object of the invention is to provide an improved control circuit for such bistable circuits in which a high input impedance is presented.

Still another object of this invention is to provide a novel control circuit suitable for use with a transistorized bistable circuit which control circuit is adapted to receive either D.C. level shift inputs or pulse inputs.

Certain other objects, advantages and features of the invention will be seen as the following description of the preferred embodiment progresses, in conjunction with the drawings, in which:

FIG. 1 is a schematic diagram of a flip-flop and a control circuit according to a first embodiment of the invention which is particularly adapted to receive pulse inputs; and FIG. 2 is a schematic diagram of a control circuit according to a second embodiment of the invention which is adapted to receive both D.C. level shift inputs and pulse inputs for control of the flip-flop.

The circuitry of the flip-flop will be described first and then the input control circuitries will be described.

With reference to FIG. 1, the flip-flop circuitry according to a preferred embodiment includes four p-n-p transistors, two connected in grounded emitter configuration and two connected in the grounded collector configuration. The ONE circuitry includes transistors 10 and 12 and the ZERO circuitry includes transistors 14 and 16. The output (terminal 18) of the ONE circuitry is cross coupled to the input (terminal 20) of the ZERO circuitry through resistor 64 and capacitor 54 and through resistor 22. The output (terminal 24) of the ZERO circuitry is coupled to the input (terminal 26) of the ONE circuitry through resistor 62 and capacitor 52 and through resistor 28. When the flip-flop of this embodiment is in the ZERO condition the ZERO output terminal 24 is at ground and the ONE output terminal 18 is at approximately −V.

The condition of the flip-flop circuitry is changed from ZERO to ONE by the application of a negative pulse to the base of the transistor 10. This negative pulse drives transistor 10 on by forward biasing its emitter-base circuit, thus permitting current flow in its emitter-collector circuit. Part of this current is passed through diode 30 to charge stray or load capacity at terminal 18 such that the potential at the ONE terminal 18 is raised approximately to ground. That potential is held substantially at ground by the emitter follower action of transistor 12. The rise transition at the output terminal 18 is cross coupled through resistor 64 and capacitor 54 to input terminal 20. This cross coupling of the rising ONE output to the ZERO input raises the potential on the base of transistor 14 above ground driving that transistor off by removing the forward biasing potential on the base-emitter circuit of transistor 14 such that its emitter-collector circuit ceases conduction. The ground level at terminal 18 maintains transistor 14 off in the static state by the voltage divider action of resistors 22 and 38, the latter being connected to a source of positive voltage $V_1$. (Diode 32 is utilized to clip excessive positive overshoot from terminal 20.)

When transistor 14 is switched off the potential on the base of transistor 16 falls, forward biasing its emitter-base junction. The resulting conduction through the emitter-collector circuit of that transistor causes the potential at output terminal 24 to fall to about −V. This potential is coupled back to the base of transistor 10 through resistor 28 thus holding that transistor in conducting condition. In order for this flip-flop to change state it is necessary that the off inverter transistor be driven on and the on inverter transistor be driven off.

The output transistors 12 and 16, connected in emitter follower configuration, provide a low impedance output from the flip-flop. Diodes 30 and 34 are utilized to improve the rise and fall characteristics of the output transitions. Resistors 36 and 38 are provided to supply $I_{co}$ and thus insure that the inverter transistor 10 or 14 remains off when the opposite output is up. Resistors 40 and 42, connected between the positive source $V_1$ and output terminals 24 and 18 respectively, supply emitter potential to the output transistors 12 and 16 and resistors 44 and 46, connected between the collectors of transistors 10 and 14 respectively and the negative voltage source $V_1$ serve as collector load resistors for the inverter stages.

In resume, the multivibrator consists of two identical circuits or sides which are cross coupled to each other. Each side includes a grounded emitter inverter transistor and a grounded collector output transistor. An input pulse is applied to the base of the off inverter transistor through a coupling capacitor to drive that transistor on. The resulting current flow in the output circuit produces a change in voltage at the output terminal which is coupled to the base of the other inverter transistor through a corresponding coupling capacitor to drive that transistor off. Resistive cross-coupling maintains the condition of the circuit until an input pulse is applied to the presently off transistor. In this circuit, drive-on and drive-off signals are coupled to the inverter transistors through a single capacitor associated with each transistor. As conventional overdrive capacitors are eliminated a capacitive voltage divider effect which would reduce the percentage of the input pulse applied to the base is thus avoided.

The pulse control or steering circuit includes two pull-over transistors 48, 50 of the p-n-p type which are connected in emitter follower configuration, one being associated with each input side. The emitter of each transistor is connected through a capacitor 52, 54 respectively to the input terminal of each circuit. Each emitter is also cross coupled through the feed back resistor 62, 64 to the output terminal 24, 18 respectively associated with the opposite side of the flip-flop. A plurality of inputs are connected through a conventional diode OR circuit 56, 58 to the base of each pullover transistor. One of the input lines associated with the ONE side and a corresponding line associated with the ZERO side are connected together in conventional manner to provide a complementing input 60.

The application of a negative pulse on an input line associated with the side of the flip-flop that is down (off) causes the emitter-base junction of that pull-over transistor to become forward biased so that the negative voltage transition appears at the emitter. That transition is coupled through the capacitor to the associated input terminal, thus causing the flip-flop to change state as explained above. When a negative pulse is applied to the complement input 60, the emitter base junction of the transistor associated with the side that is off becomes forward biased such that the pulse is coupled to the input terminal of the off side. The emitter of the other transistor is held at —V through the feedback connection including a resistor 62 or 64 and therefore the reverse biased condition of that emitter-base junction is not changed by the pulse at terminal 60.

When the flip-flop is in the ZERO state (transistor 14 is on), the emitter of transistor 48 is connected to ground potential (through resistor 62) and the emitter of transistor 50 is connected to —V (through resistor 64). A negative voltage transition of —V, applied at terminal 60, therefore does not appear at the emitter of transistor 50 as its emitter-base junction remains back biased. The emitter-base junction of transistor 48, however, becomes forward biased and the negative transition appears at its emitter. This transition is coupled through capacitor 52 to the input 26 of the ONE circuit (the base of transistor 10) and causes the flip-flop to change to the ONE state.

This input control circuit provides a simple circuit for suitable control and transfer of input pulses for operation of a flip-flop. The control circuitry presents a high input impedance to incoming signals which permits connected input circuits to be physically located at a distance from the flip-flop circuit. The number of driving circuits (pulse amplifiers) also is substantially reduced.

Suitable values for the components are as follows:

| | |
|---|---|
| Resistors: | |
| 22 | 1,800 ohms. |
| 28 | 1,800 ohms. |
| 36 | 100,000 ohms. |
| 38 | 100,000 ohms. |
| 40 | 910 ohms. |
| 42 | 910 ohms. |
| 44 | 620 ohms. |
| 46 | 620 ohms. |
| 62 | 150 ohms. |
| 64 | 150 ohms. |
| Capacitors: | |
| 52 | 220 $\mu\mu$f. |
| 54 | 220 $\mu\mu$f. |
| Transistors: | |
| 10 | Philco Type MADT. |
| 12 | Do. |
| 14 | Do. |
| 16 | Do. |
| 48 | Philco Type MAT. |
| 50 | Do. |
| Diodes (all) | Transitron Type TG6. |
| Voltages: | |
| V | 3.5 volts. |
| $V_1$ | 9.5 volts. |

A steering circuit which permits the use of either pulse or D.C. level inputs with the flip-flop circuitry of FIG. 1 is shown in FIG. 2.

The circuitry of FIG. 1 is suitable for both single-sided and complement pulse inputs, and for single-sided D.C. level inputs. However, the circuitry must be modified to accept D.C. shift levels as complement inputs due to their longer duration. This is necessary as the drive-on and drive-off signals for each inverter transistor are applied through the same capacitor and the input level must be applied in a manner to avoid deterioration of the drive-off signal.

As the same flip-flop circuitry is suitable for use with this steering circuit it is not illustrated in FIG. 2. The corresponding terminals are identified with the same reference numerals. The transistors 48' and 50' are p-n-p transistors connected in emitter follower configuration. A single input capacitor 52', 54' is utilized to couple drive-on and drive-off signals to the base of the inverter transistor. The input diode OR circuits 56', 58' are similar to circuits 56, 58 with the exception that the resistors 66, 68 respectively are not grounded but are connected to the output terminal of the opposite side of the flip-flop. A coupling capacitor 70, 72, respectively, is connected between the OR circuit 56', 58' and the base of the transistor 48', 50'. Diodes 74 and 76 clamp the bases of transistors 48' and 50' respectively to ground. Diodes 78 and 80 are connected between the base of the transistors 48', 50' respectively and the output terminals 18, 24 respectively of the associated sides of the flip-flop.

Consider the ONE side of the flip-flop to be off and the ZERO side to be ON in the steady state condition with the inputs at ground. In this condition the ONE output terminal 18 is at approximately —V and the ZERO output terminal 24 is at ground. The emitter of transistor 48' and the left end of capacitor 70 thus are connected to ground potential through resistors 62' and 66 respectively while the emitter of transistor 50' and the right end of capacitor 72 are connected to a potential of —V through resistors 64' and 68 respectively. The bases of both transistors 48', 50' are at ground as will be explained hereinafter.

A D.C. level shift input, in the form of a negative transition from ground to —V, applied through the complement input 60' to the diode OR circuits 56' and 58' will cause the connected diode in OR circuit 56' to forward bias, thus bringing the left end of capacitor 70 down to about 0.3 volt more positive than —V. The connected diode in OR circuit 58' remains back biased during the negative transition of the input signal as its anode is held at —V through resistor 68 and therefore the right end of capacitor 72 remains at —V. Thus a signal at the complement input 60' sees the input impedance of only one capacitor and is applied to the input of the side that is OFF. Capacitor 70 couples the negative transition appearing at its left end to the base of transistor 48'. Diode 78, connected to output terminal 18, is maintained in a back biased condition during this voltage transition and thus does not prevent the base of transistor 48' from going negative. The negative transition, applied to the base of the transistor 48', causes its emitter-base junction to become forward biased so that the negative transition appears at the emitter and is coupled by capacitor 52' to the input terminal 26.

Since the ONE side of the flip-flop was OFF in the steady state, this negative transition causes the ONE side to turn ON and the output voltage at terminal 18 rises from —V to ground. This rise in the ONE output appears at the emitter of transistor 50' through resistor 64' since the emitter-base junction of that transistor has remained in back biased condition. Capacitor 54' couples this rise in voltage to the ZERO input terminal 20 of the flip-flop, as a drive-off signal causing the ZERO side to turn OFF and the output voltage at terminal 24 falls from ground to —V as a result. The DC cross coupling of the ZERO output to the ONE input terminal 26 and the ONE output to the ZERO input terminal 20 through resistors 28 and 22 respectively (FIG. 1) maintains this state.

The rise of voltage toward ground at terminal 18 also causes diode 78 to forward bias, returning the base of transistor 48′ to ground. Since the ZERO output terminal 24 falls just slightly after the ONE output rises, the emitter of transistor 48′ does not follow this rise in the ONE output but is held at −V by the ZERO output level through resistor 62′ and the emitter-base junction becomes back biased. Thus the input signal as seen by the steering transistor associated with the side of the flip-flop which is turned ON is in the form of a pulse rather than the D.C. level actually applied.

When the ONE output rises, current starts to flow through resistor 68 and the diode in OR circuit 58′ which is connected to the input 60′ as the voltage on that input is still at −V. The subsequent rise of the voltage level on the input 60′ causes the diode in the OR circuit 58′ to become back biased and allows capacitor 72 to charge through resistor 68 and diode 76. The bottom of resistor 68 rises to ground but the base of transistor 50′ remains at ground since it is clamped to ground by diode 76.

The bottom of resistor 66 remains at −V when the complement input 60′ rises to ground since it is connected through resistor 66 to the ZERO output terminal 24 which is now at −V. The steering circuitry thus is conditioned to receive another negative going level shift.

In résumé, the portion of the steering circuit of FIG. 2 associated with each flip-flop input includes a transistor switching device connected in emitter follower configuration. Input signals are applied to the base of the transistors through an alternatively conditioned OR circuit and a coupling capacitor. Reestablishment of a back biased condition of the transistors prior to removal of the input signal level is permitted. A feedback connection from a flip-flop output returns the transistor to back biased condition.

A pulse input produces substantially the same action as the D.C. level input described above. The steering circuit thus may be used in a wide variety of circuit applications. Such versatility has advantages which result in computer design simplification, reduced fabrication costs, and improved inventory status of spare components. The circuit has been operated with both D.C. level shift and pulse inputs and at a rate in excess of five megacycles.

The following values for the components shown in FIG. 2 are suitable for such operation:

| | |
|---|---|
| Resistors: | |
| 62′ | 150 ohms. |
| 64′ | 150 ohms. |
| 66 | 1,000 ohms. |
| 68 | 1,000 ohms. |
| Capacitors: | |
| 52′ | 470 μμf. |
| 54′ | 470 μμf. |
| 70 | 100 μμf. |
| 72 | 100 μμf. |
| Transistors: | |
| 48′ | Philco Type MAT. |
| 50′ | Do. |
| Diodes (all) | Transitron Type T6G. |
| Voltage V | 3.5 volts. |

While there have been shown and described herein preferred embodiments of the invention, it will be understood that the invention is not intended to be limited thereto or to details thereof and departures may be made therefrom within the spirit and scope of the invention as defined in the following claims.

I claim:

1. In a bistable multivibrator having two cross-coupled circuits, each circuit having an input and an output and including a high speed switching transistor and a coupling element adapted to apply drive-on and drive-off signals to said transistor, one of said transistors being in conducting state and the other transistor being in non-conducting state except during transitions, an input control circuit associated with each cross-coupled circuit comprising an impedance transforming device arranged to present a high input impedance and a low output impedance, and adapted to apply a drive-on signal to said coupling element in response to an input signal, means responsive to an output of said multivibrator adapted selectively to inhibit application of said drive-on signals to said transistors, and means to apply a multivibrator complementing signal to both input control circuits simultaneously, said inhibiting means being operative to prevent said complementing signal from causing the application of a drive-on signal to the transistor that is in conducting state.

2. The circuitry as claimed in claim 1 wherein said device is a transistor connected in circuit in emitter follower configuration.

3. The circuitry of claim 1 wherein said device is a p-n-p transistor and includes a semiconductive body, a base electrode, an emitter electrode and a collector electrode in contact with said body, said emitter being connected to said coupling element and to an output, said base being connected to signal applying means and said collector being connected to a voltage source, said transistor being connected such that said means responsive to an output is adapted to reverse bias the emitter-base junction of one p-n-p transistor and a complementing signal in the form of a negative voltage transition applied to said base is adapted to forward bias the emitter-base junction of the other p-n-p transistor applying a drive-on signal to the connected coupling element.

4. In a bistable multivibrator having two cross-coupled circuits, each circuit having an input terminal, an output terminal, an active element and a coupling device arranged in circuit to couple actuating signals to said active element, an input circuit adapted to receive both pulse and D.C. level input signals associated with each of said cross-coupled circuits comprising a gain producing device adapted to present a high input impedance and a low output impedance and arranged in circuit to transfer an input signal to said coupling device, means to apply an input signal adapted to complement said multivibrator to both input circuits simultaneously, capacitive means adapted to couple said input signal to said gain producing device, means responsive to a signal from one output terminal to inhibit application of said input signal to said capacitive means, and means responsive to a signal from the other output terminal to remove said input signal from said gain producing device after its application thereto.

5. The circuitry as claimed in claim 4 wherein said gain producing device is a transistor having a base electrode, an emitter electrode and a collector electrode, and further including a voltage source, said base electrode being connected to said capacitive means, said emitter electrode being connected to said coupling device and said collector electrode being connected to said voltage source, whereby an input signal applied to said base is adapted to forward bias the emitter-base junction of said transistor so that said signal is transferred to said coupling device.

6. The circuitry as claimed in claim 5 wherein said means to remove said input signal includes a unidirectional current device connected between an output terminal and the junction between said capacitive means and said base, said unidirectional device connected in circuit to be reverse biased when said signal is applied to said base and to become forward biased subsequently to remove the input signal level from said base.

7. In a bistable multivibrator having two cross-coupled circuits, each circuit having an input, an output, an active element and a coupling device arranged to couple actuating signals to the input of said active element, one of said circuits being in conducting state and the other circuit being in non-conducting state except during transitions therebetween, an actuating signal control circuit adapted to receive both pulse and D.C. level input signals comprising an asymmetrically conductive device associated with each of said cross-coupled circuits having an input terminal and an output terminal, each said asymmetrically conductive devices being adapted to conduct and apply an actuating signal to the associated multivibrator input, means for applying an input signal for changing the state of said multivibrator to both said input terminals simultaneously, means responsive to the multivibrator outputs connected to each output terminal for selectively permitting only one of said asymmetrically conductive devices to conduct in response to an input signal and apply an actuating signal to a multivibrator input to change the state of said multivibrator, and means responsive to the changed state of said multivibrator adapted to remove the actuating signal from the multivibrator input irrespective of the continued application of the input signal.

References Cited in the file of this patent

UNITED STATES PATENTS

| | | |
|---|---|---|
| 2,478,683 | Bliss | Aug. 9, 1949 |
| 2,536,808 | Higinbotham | Jan. 2, 1951 |
| 2,719,228 | Auerbach et al. | Sept. 27, 1955 |
| 2,787,712 | Priebe | Apr. 2, 1957 |
| 2,831,127 | Braicks | Apr. 15, 1958 |
| 2,846,583 | Goldfischer | Aug. 5, 1958 |
| 2,924,725 | Blair | Feb. 9, 1960 |

OTHER REFERENCES

Junction Transistor Switching Circuits for High Speed Digital Computer Applications, by Prom and Crosby, February 1953, published by Sylvania Electric Products Inc., pages 7–12.

Transient Analysis of Transistor Amplifiers, by Chow and Suran, pages 189–191, Electronics, November 1953.